United States Patent
Scholz et al.

(10) Patent No.: US 6,371,784 B1
(45) Date of Patent: Apr. 16, 2002

(54) ZERO INSERTION FORCE CONTACT FOR USE WITH A PIN GRID ARRAY

(75) Inventors: James Paul Scholz, Mechanicsburg; Benjamin Howard Mosser, III, Middletown; Andrew Jacob Vasbinder, York, all of PA (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/453,377

(22) Filed: Dec. 2, 1999

(51) Int. Cl.$^7$ ............................................. H01R 13/625
(52) U.S. Cl. ..................... 439/342; 439/71; 439/266; 439/259
(58) Field of Search ............................ 439/71, 70, 342, 439/344, 856, 857, 268, 266, 66, 83, 259

(56) References Cited

U.S. PATENT DOCUMENTS

| | | | |
|---|---|---|---|
| 4,498,725 A | * 2/1985 | Bright et al. | 339/176 |
| 4,934,967 A | 6/1990 | Marks et al. | 439/856 |
| 5,791,929 A | 8/1998 | Banakis et al. | 439/342 |
| 5,797,774 A | * 8/1998 | Kaneko | 439/857 |
| 5,984,694 A | * 11/1999 | Sinclair | 439/70 |
| 6,113,412 A | * 9/2000 | Lin | 439/342 |
| 6,142,810 A | * 11/2000 | Hsiao et al. | 439/342 |
| 6,193,537 B1 | * 2/2001 | Harper, Jr. et al. | 439/291 |

FOREIGN PATENT DOCUMENTS

| | | |
|---|---|---|
| EP | 0095877 | 5/1983 |
| FR | 2 775 133 | 2/1999 |

OTHER PUBLICATIONS

PCT International Search Report for application No. PCT/US 00/32740.

* cited by examiner

*Primary Examiner*—Tho D. Ta
*Assistant Examiner*—Truc Nguyen (57) ABSTRACT

A contact to electrically connect at least one pin of a pin grid array to a printed circuit board is described. The contact comprises a receiving portion having a pair of contact arms, with each contact arm having a curved portion and a straight portion. The contact arms are positioned so that the curved portions form a curved receiving area while the straight portions are substantially parallel to each other to form a contact area. The contact also includes a tail portion having a solder ball receiving portion. The contact further includes a center portion connecting the pin receiving portion to the tail portion.

21 Claims, 9 Drawing Sheets

ZERO INSERTION FORCE CONTACT FOR USE WITH A PIN GRID ARRAY

FIELD OF THE INVENTION

The invention relates to connectors in general. More particularly, the invention relates to a contact for use with a socket to receive pins from a pin grid array (PGA).

BACKGROUND OF THE INVENTION

The speed at which computers operate is becoming increasingly faster. At the heart of a computer is a computer processor. The processor is always in a constant state of technical innovation. It seems that everyday new applications are being created that demand a faster and more powerful processor. As the speed of the processor increases, it becomes increasingly important for all the components in the data processing path to become faster in order to prevent data congestion or "bottlenecks." This includes the interface that connects a processor to a printed circuit board (sometimes referred to as a "mother board").

One example of such an interface is referred to as a Pin Grid Array (PGA) socket. The PGA socket is designed to receive a pin grid array of a processor and to establish an electrical connection between the processor and the printed circuit board. The PGA socket varies in type in accordance with such design factors as the number of pins in the pin grid array, the type of contacts located in the PGA sockets, the locking mechanism for maintaining a connection between the contacts and the pins of the pin grid array, and so forth.

One often desirable design feature of a PGA socket is a Zero Insertion Force (ZIF) PGA socket. A ZIF PGA socket is a PGA socket that requires little or no force to insert the pins of the pin grid array into the corresponding PGA sockets. Once the pins of the pin grid array are inserted into the corresponding PGA sockets, a mechanism included with the socket is operated to move the pins into registration with the socket contacts and into electrical engagement therewith.

Another desirable feature of a PGA socket is the number of socket contacts offered by the PGA socket. Current processors have pin grid arrays with hundreds of pins. Consequently, the number of socket contacts required by the PGA socket has steadily increased to the point where a 50×50 centerline grid of sockets is necessary. In other words, each socket is approximately 0.050 inches from the sockets around it. A PGA socket having a 50×50 centerline grid of sockets is often referred to as a "micro" PGA socket.

Thus, there is a substantial need in the interface industry for a micro ZIF PGA socket to accommodate the mechanical and electrical requirements of modern day processors. In order to provide a micro ZIF PGA socket, however, the type of contacts used by the socket becomes critically important. The contact performs many functions, not the least of which is to provide electrical contact between the pin and printed circuit board. As each desirable design feature is introduced for a processor and hence the PGA socket, the electrical and mechanical design constraints for the contact become more stringent. For example, as the processing speed of a processor increases, the amount of inductance tolerated from the contact is reduced. Conventional contacts have an inductance value of 5–6 nanohenrys (nh). Modern day processors, however, require an inductance value of no more than 3.7 nh. Moreover, many processors require that the height of the contact remain the same as previous contacts. In addition, the desire for the ZIF feature requires a pin receiving portion that is capable of receiving a pin without providing any resistance, and of being moved into contact with the pin to provide the electrical connection. Furthermore, the overall width of the contact must be such that it fits within a socket designed for a 50×50 centerline grid. Each of these design constraints provide a formidable challenge in the design of the contact to perform as desired.

In view of the foregoing, it can be appreciated that a substantial need exists for a contact that solves the above-discussed problems.

SUMMARY OF THE INVENTION

The embodiments of the invention include a contact to electrically connect at least one pin of a pin grid array to a printed circuit board. The contact comprises a receiving portion having a pair of contact arms, with each contact arm having a curved portion and a straight portion. The contact arms are positioned so that the curved portions form a curved receiving area while the straight portions are substantially parallel to each other to form a contact area. The contact also includes a tail portion having a solder ball receiving portion. The contact further includes a center portion connecting the pin receiving portion to the tail portion.

With these and other advantages and features of the invention that will become hereinafter apparent, the nature of the invention may be more clearly understood by reference to the following detailed description of the invention, the appended claims and to the several drawings attached herein.

DETAILED DESCRIPTION

The embodiments of the invention comprise a contact for use with PGA sockets, or more particularly, micro ZIF PGA sockets. In one embodiment of the invention, the contact comprises a pin receiving portion, a center portion and a tail portion. The pin receiving portion receives and guides the pin into the socket while providing physical contact between the pin and the contact to establish the electrical connection. The center portion serves to help stabilize the pin and provide an electrical connection to the connecting portion. The tail portion connects the pin receiving portion and the center portion to the printed circuit board via a solder ball.

The embodiments of the invention are designed, among other things, to reduce the inductance value of the socket contacts. Conventional contacts have an inductance value of 5–6 nanohenrys (nh) at a standard contact height. The contacts described in the embodiments of the invention, however, provide an inductance value of approximately 3.7 nh or lower. Furthermore, the lower inductance value is gained without lowering the standard contact height used by many conventional contacts. This is accomplished, in part, by widening the center portion or main body of the contact. The unique design of the embodiments of the invention permit the increased width without significantly impairing or hindering the manufacturing process for both the sockets and the contacts themselves. Moreover, the contacts are designed to accommodate the ZIF feature that requires a pin receiving portion that is capable of receiving a pin without providing any resistance, and of being moved into contact with the pin to provide the electrical connection. Furthermore, the overall width of the contacts used in the embodiments of the invention is such that they fit within a socket designed for a 50×50 centerline grid.

It is worthy to note that any reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
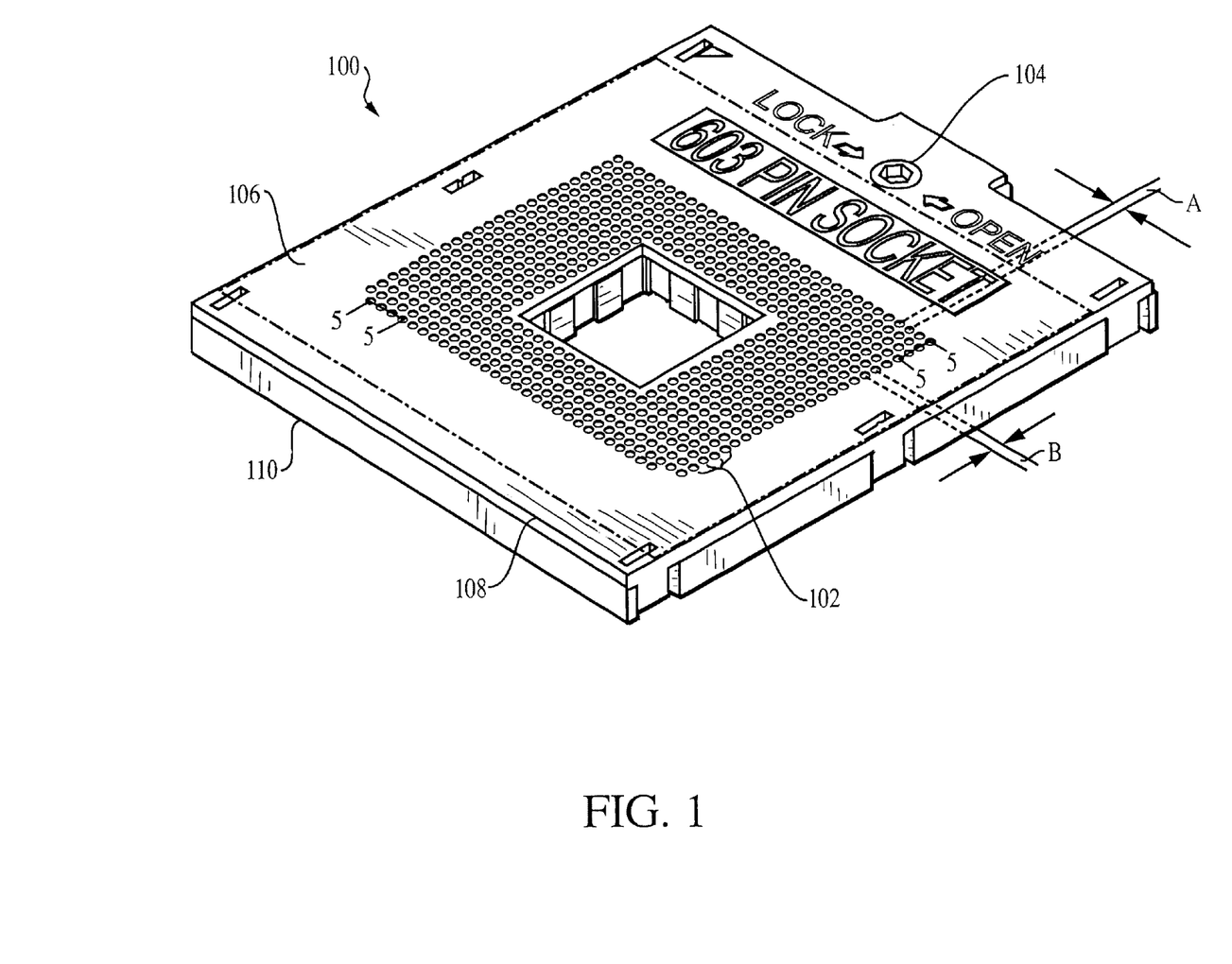
FIG. 1 shows a micro ZIF PGA socket suitable for use with one embodiment of the invention.

Referring now in detail to the drawings wherein like parts are designated by like reference numerals throughout, there is illustrated in FIG. 1 a micro ZIF PGA socket suitable for use with one embodiment of the invention. As shown in FIG. 1, a micro ZIF PGA socket 100 includes an insulative cover 106 with a plurality of apertures 102 extending through the cover 106. The cover 106 includes an upper face 108 and a lower face 110. The apertures 102 of socket 100 are aligned in a 50×50 centerline grid, where the distances "A" and "B" are approximately 0.050 inches.

Socket 100 also includes a ZIF PGA CAM mechanism 104. In operation, the pins of a pin grid array are inserted into the corresponding apertures 102 of respective sockets with the apertures providing little or no resistance to the pins. Once the pins of the pin grid array are inserted into openings of the corresponding PGA apertures, the ZIF PGA CAM mechanism 104 is operated to move the pins into registration with the socket contacts and into electrical engagement therewith.

Socket 100 is profiled for receiving a pin grid array of a processor. An example of such a pin grid array is shown in FIG. 2.

Figure 2:
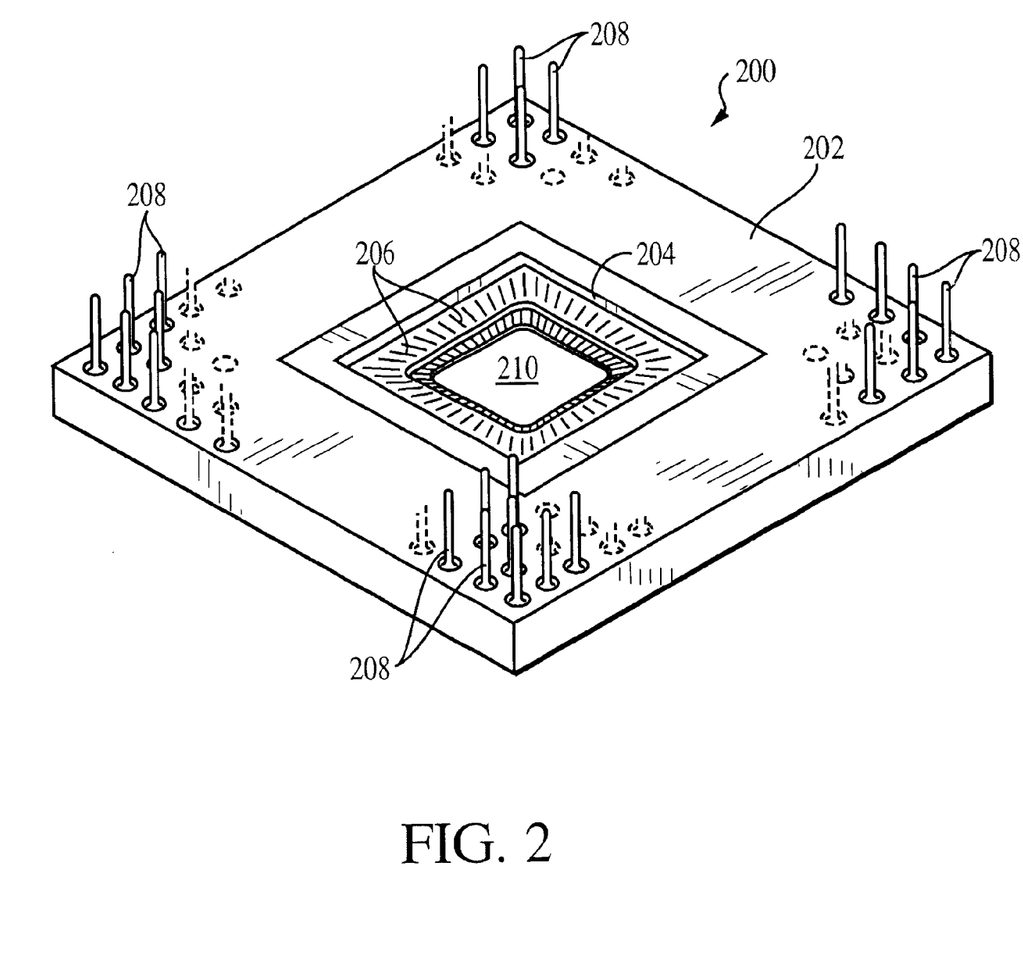
FIG. 2 shows a pin grid array suitable for use with one embodiment of the invention.

FIG. 2 shows a pin grid array suitable for use with one embodiment of the invention. FIG. 2 shows a pin grid array 200 that includes a carrier receiving body 202. Carrier receiving body 202 has a plurality of pins 208 configured in a dense array. In this embodiment of the invention, the pins are configured in a 50×50 centerline grid to match micro ZIF PGA socket 100. Pin grid array 200 further comprises a chip receiving pocket 204, that receives a leadless chip 210 in a protective manner and serves as a nest in which chip 210 can be brazed, epoxied or otherwise attached. A plurality of traces 206 are included on the carrier receiving body 202 and are defined in a pattern extending downwardly into the chip receiving pocket 204 for electrical interconnection with the leadless chip. The traces 76 extend outwardly from the chip receiving pocket 204 and are electrically interconnected to respective pins 208 of the carrier receiving body 202.

Figure 3:
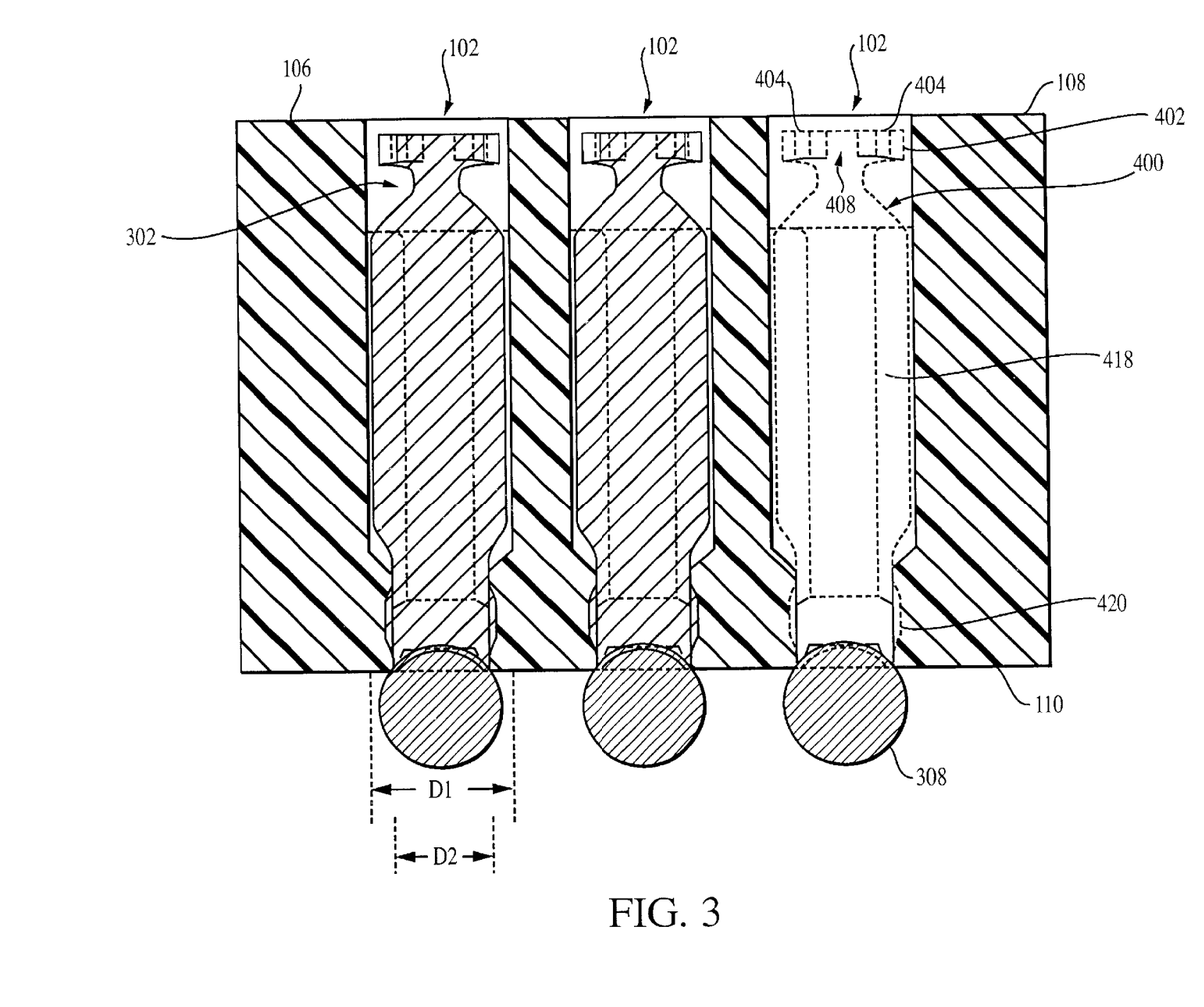
FIG. 3 shows a cross-sectional view through lines 5—5 of FIG. 1.

FIG. 3 shows a cross-sectional view through lines 5—5 of FIG. 1. As shown in FIG. 3, a plurality of contacts 400 are inserted within a cavity 302 of the insulative cover 106 through the apertures 102 of upper face 108. The cavity 302 has a first width of D1, and a second width D2, with D1 being greater than D2. Each of the contacts 400 is attached to a printed circuit board (not shown) via a solder ball 308 through the lower face 110.

Figure 4:
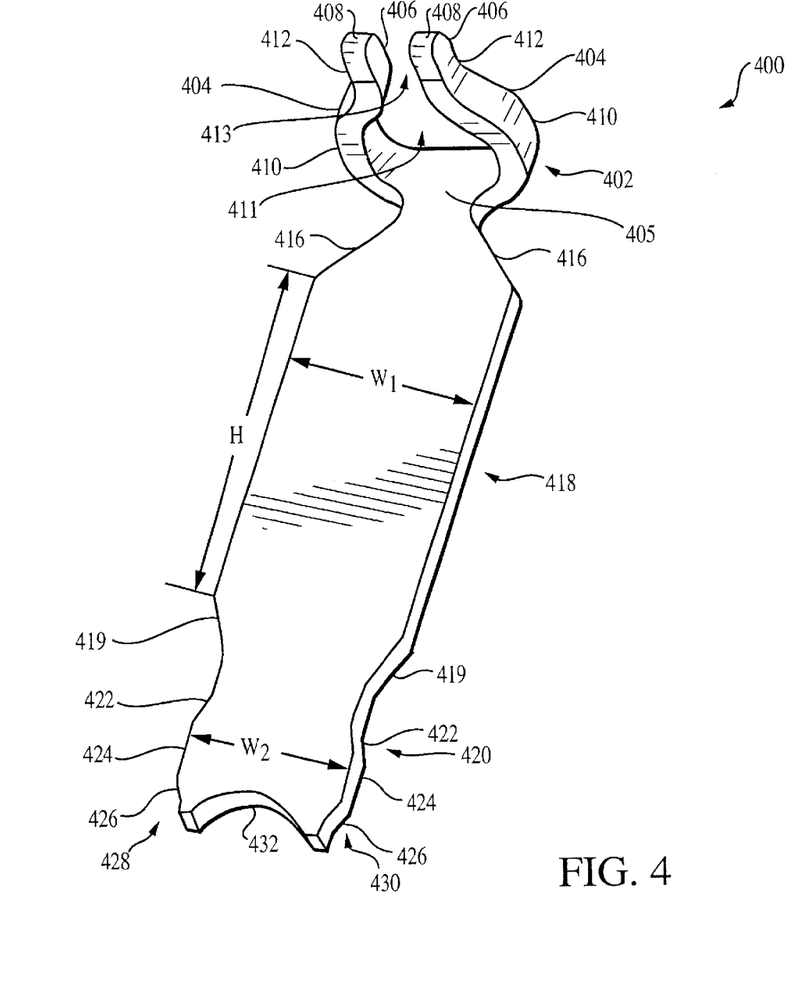
FIG. 4 is a perspective view of a contact in accordance with one embodiment of the invention.
Figure 5:
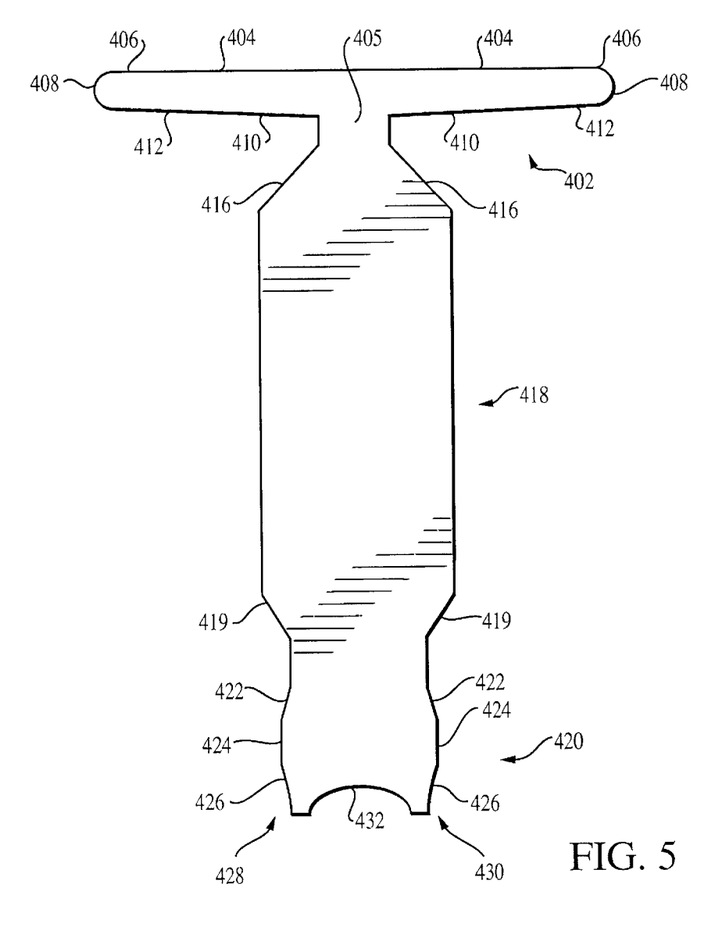
FIG. 5 shows a flat view of a contact as stamped from a piece of conductive material in accordance with one embodiment of the invention.

FIG. 4 is a perspective view of a contact in accordance with one embodiment of the invention. Contacts 400 each comprise a pin receiving portion 402, a center portion 418 and a tail portion 420. The pin receiving portion 402 further includes contact arms 404. Each contact arm 404 comprises a curved portion 410, a straight portion 412, and a contact arm end 406. The contacts 400 are stamped and formed from a flat blank sheet of conductive material as shown in FIG. 5. In this embodiment of the invention, the conductive material is beryllium copper which provides a relatively high level of conductivity. Thus, when the blank is rolled to form contact arms 404, a contact area 413 is defined. Each of the contact arms 404 is inwardly directed towards the center of a back plate 405 such that curved portions 410 form a curved receiving area 411, while the straight portions 412 are substantially parallel to one another to form a contact area 413.

The contact arms 404 have a contact arm end 406 at the end of each arm 404. The contact arm ends 406 form electrical contact points for, for example, pins 208 when the pins 208 are locked into place using CAM mechanism 104. The contact arm ends 406 also have radiused portions 408. The radiused portions 408 are designed to help the contact arms 404 of contact 400 to fit within the relatively small cavity 302 such as, for example, during the insertion and removal process.

The center portion 418 is connected to the pin receiving portion 402 via center portion upper shoulders 416, and to tail portion 420 via center portion lower shoulders 419. The width W1 of center portion 418 is less than width D1 of cavity 302, but wide enough to decrease the inductive value of contact 400 to equal to or less than 3.7 nh. In this embodiment of the invention, the width W1 of the center portion 418 is approximately 0.0340 inches, while the height H of the center portion 418 is approximately 0.0650.

The tail portion 420 comprises a first side 428 and a second side 430, with each side comprising a tail portion center 424 connected to both a tail portion upper shoulder 422 and a tail portion lower shoulder 426. The tail portion 420 is connected to the center portion 418 via tail portion upper shoulder 422. The tail portion 420 also includes a solder ball receiving portion 432. The solder ball receiving portion 432 forms a radiused curve to increase contact points between the solder ball receiving portion 432 and a solder ball such as solder ball 308.

The configuration of tail portion 420 results in a center portion of tail portion 420 being wider than the top and bottom portions of tail portion 420. The wider center portion has a width W2 that matches the inner width D2 of cavity 302. The wider center prevents excess solder from solder ball 308 from entering cavity 302 during the process of connecting solder ball receiving portion 432 with solder ball 308, sometimes referred to as a "wicking" effect. The wider center also helps seat and retain the contact 400 in the cavity 302.

Figure 6:
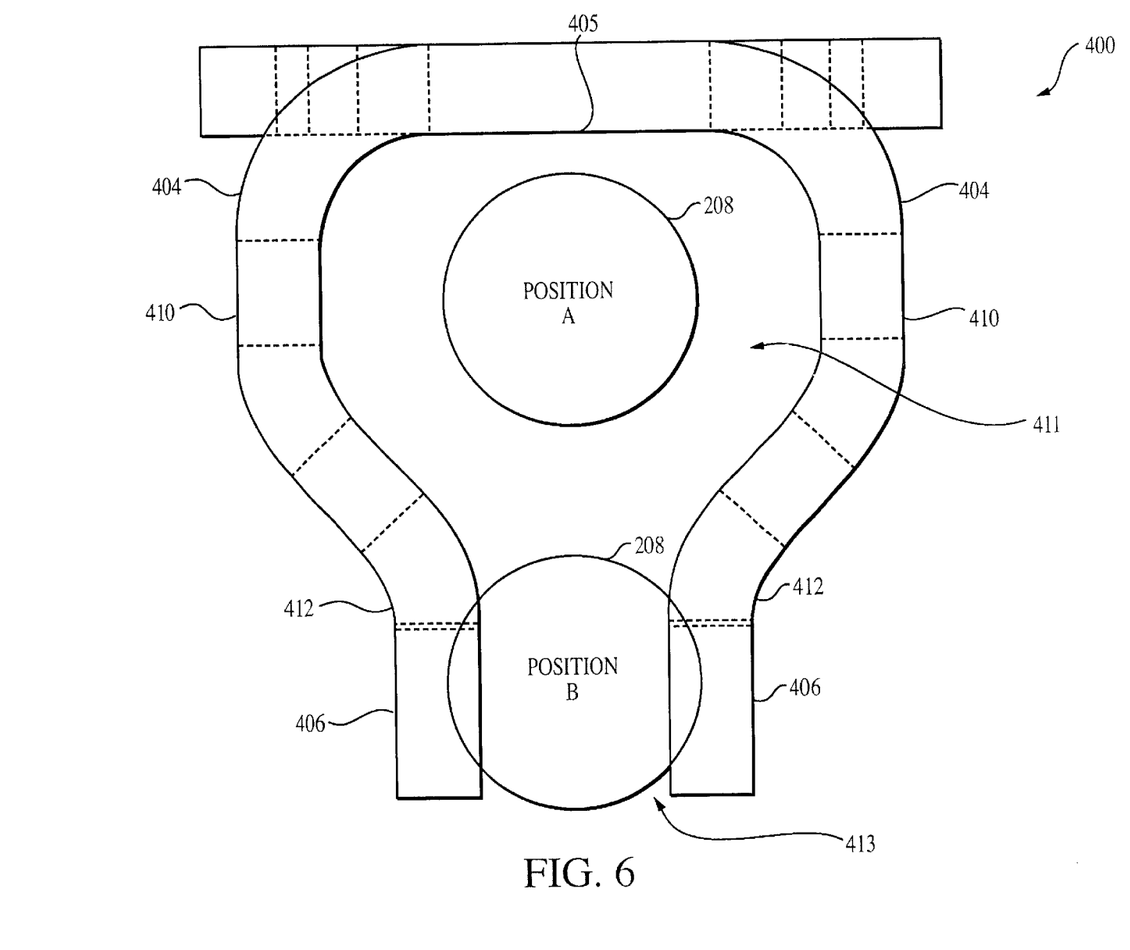
FIG. 6 shows a top view of a pin inserted into a pin receiving portion of a contact in accordance with one embodiment of the invention.

FIG. 6 shows a top view of a pin inserted into a pin receiving portion of a contact in accordance with one embodiment of the invention. Contact 400 is designed to work with a ZIF PGA socket. As indicated by the term "Position A", a pin such as pin 208 is inserted into an aperture 102 of cover 106 through the middle of the curved receiving area 411 of pin receiving portion 402. Since the width of pin 208 is smaller than the curved receiving area 411 formed by contact arms 404, the pin 208 can be inserted into the pin receiving portion 402 of the contact 400 with little or no force by the person or machine actually inserting the pin 208. Given the relative density of the pin grid arrays of modern day processors, the ZIF feature of a PGA socket becomes increasingly important from a manufacturing point of view. Furthermore, the use of a ZIF PGA socket decreases the likelihood that the pins or contact might bend or break during the insertion process. Once the pin 208 is inserted through the curved receiving area 411, a CAM mechanism such as micro ZIF PGA CAM mechanism 104 is operated to move pin 208 into contact area 413 and thereby into registration with the contact arms 406 and into electrical engagement therewith, as indicated by the term "Position B."

Figure 7:
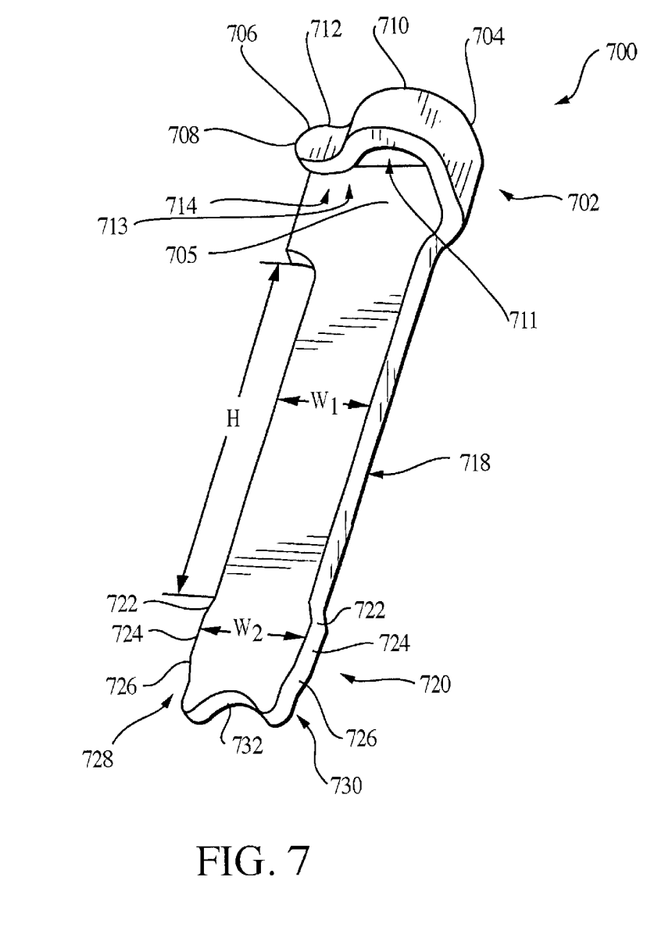
FIG. 7 is a perspective view of a contact in accordance with another embodiment of the invention.

FIG. 7 is a perspective view of a contact in accordance with another embodiment of the invention. FIG. 7 shows a contact 700 that can also be used with socket 100. Contacts 700 each comprise a pin receiving portion 702, a center portion 718 and a tail portion 720. The pin receiving portion 702 further includes a contact arm 704 and a back plate 705. Contact arm 704 comprises a curved portion 710, a straight portion 712, and a contact arm end 706. The contacts 700 are stamped and formed from a flat blank sheet of conductive material (not shown). In this embodiment of the invention, the conductive material is beryllium copper which provides a relatively high level of conductivity. Thus, when the blank is rolled to form contact arm 704, contact areas 713 and 714 are defined between straight portion 712 and back plate 705. In addition, the contact arm 704 is inwardly directed towards the back plate 705 such that curved portions 710 and back plate 705 form a curved receiving area 711 while the straight portion 712 is substantially parallel to the surface of back plate 705 to form contact area 713. Further, the width for the area between the curved portion 710 and back plate 705 is greater than the width for the area between the straight portion 712 and back plate 705 (i.e., contact areas 713 and 714).

The contact arm 704 has a contact arm end 706 at the end of contact arm 704. The contact arm end 706 and back plate 705 form contact points for, for example, pins 208 when the pins 208 are locked into place using CAM mechanism 104. The contact arm end 706 also has a radiused portion 708. The radiused portion 708 is designed to help the contact arm 704 of contact 700 to fit within the relatively small cavity 302 such as, for example, during the insertion or removal process.

The center portion 718 is connected to the pin receiving portion 702. By way of contrast to contact 400, the connecting areas between center portion 718 and pin receiving portion 702 and tail portion 720 are straight rather than necked down as with contact 400. The width W1 of center portion 718 is less than width D1 of cavity 302, but wide enough to decrease the inductive value of contact 700 to equal to or less than 3.7 nh. In this embodiment of the invention, the width W1 of the center portion 718 is approximately 0.0340 inches across the entire height H of center portion 718, which is approximately 0.0650.

The tail portion 720 comprises a first side 728 and a second side 730, with each side comprising a tail portion center 724 connected to both a tail portion upper shoulder 722 and a tail portion lower shoulder 726. The tail portion 720 is connected to the center portion 718 via tail portion upper shoulders 722. The tail portion 720 also includes a solder ball receiving portion 732. The solder ball receiving portion 732 forms a radiused curve to increase contact points between the solder ball receiving portion 732 and a solder ball such as solder ball 308.

The configuration of tail portion 720 results in a center portion of tail portion 720 being wider than the top and bottom portions of tail portion 720. The wider center portion has a width W2 that matches the inner width D2 of cavity 302. The wider center prevents excess solder from solder ball 308 from entering cavity 302 during the process of connecting solder ball receiving portion 432 with solder ball 308. The wider center also helps seat and retain contact 700 in the cavity 302.

Figure 8:
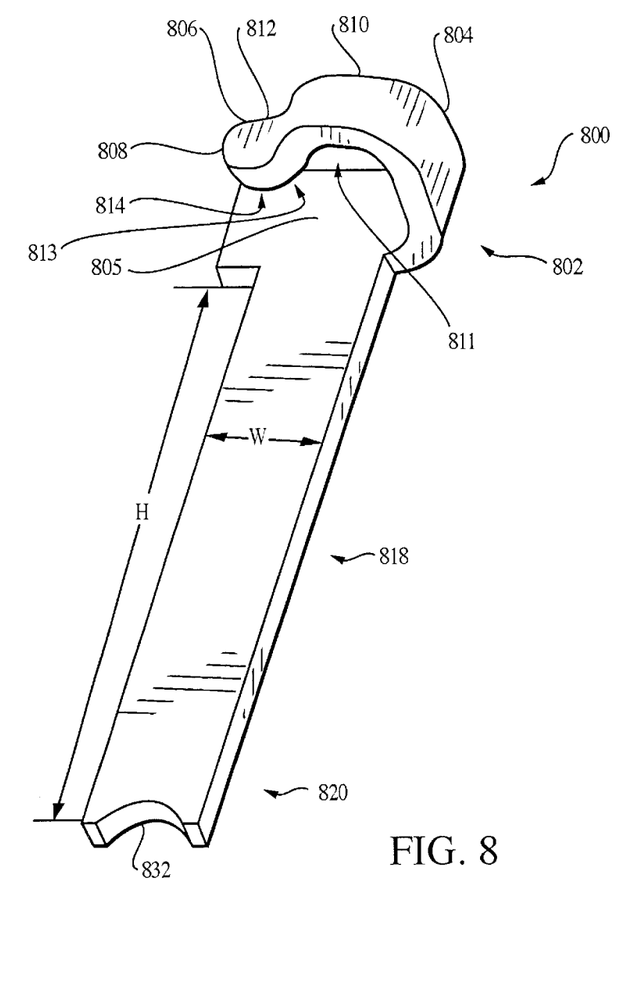
FIG. 8 is a perspective view of a contact in accordance with yet another embodiment of the invention.

FIG. 8 is a perspective view of a contact in accordance with yet another embodiment of the invention. FIG. 8 shows a contact 800 which is similar in design to contact 700 described with reference to FIG. 7. Thus, elements 802, 804, 805, 806, 808, 810, 811, 812, 813, 814, 818 and 832 of contact 800 are similar in structure and function as corresponding elements 702, 704, 705, 706, 708, 710, 711, 712, 713, 714, 718 and 732 of contact 700. Tail portion 820 of contact 800, however, differs from tail portion 720 of contact 700 to the extent that there are no equivalent elements in tail portion 820 of elements 722, 724, 726, 728 and 730. By way of contrast, tail portion 820 maintains a uniform width W as the width for center portion 818 for the entire height H of the center portion 818 and tail portion 820. In other words, the width of tail portion 820 is not increased as with tail portion 720 (indicated by W2 of FIG. 7) to help prevent wicking effects during the process of connecting solder ball receiving portion 832 with a solder ball such as solder ball 308. All the remaining electrical and mechanical aspects of contact 800, however, remain similar to that of contact 700.

Figure 9:
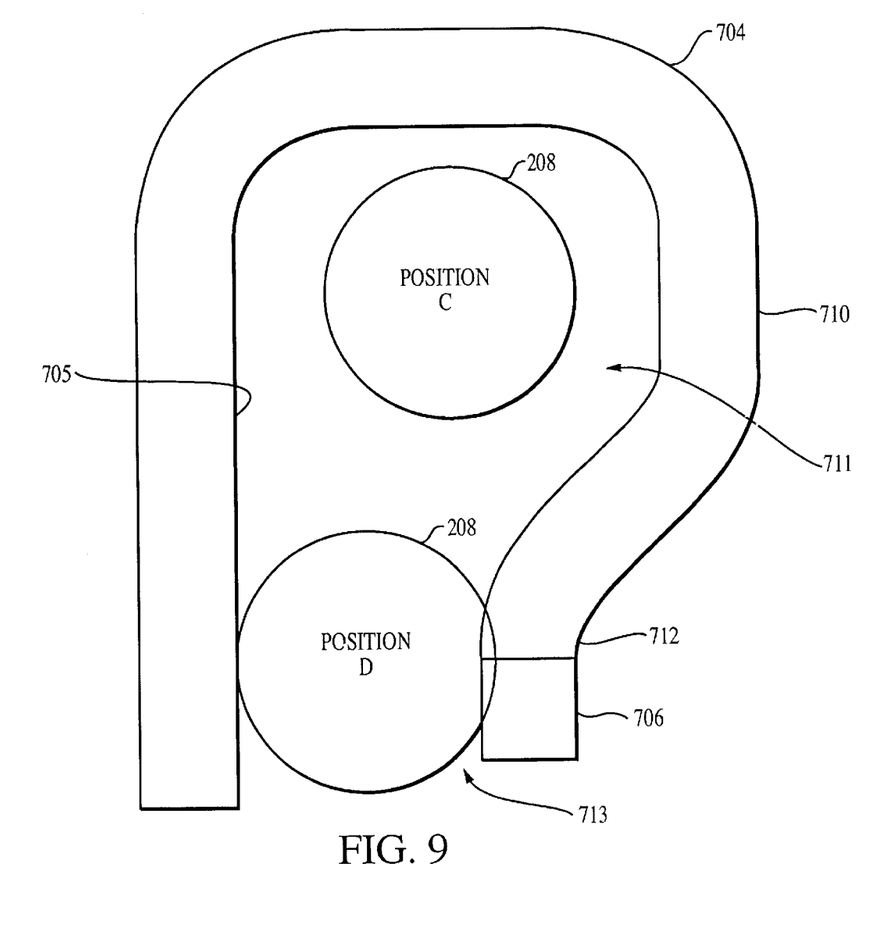
FIG. 9 is a top view of a pin inserted into a pin receiving portion of a contact in accordance with another embodiment of the invention.

FIG. 9 is a top view of a pin inserted into a pin receiving portion of a contact in accordance with another embodiment of the invention. As with contact 400, contacts 700 and 800 are designed to work with a ZIF PGA socket. Since the pin receiving portions 702 and 802 of contacts 700 and 800, respectively, are similar, the following description will be made with reference to contact 700 for the sake of clarity with the understanding that the description is also equally applicable to contact 800.

As indicated by the term "Position C", a pin such as pin 208 is inserted into an aperture 102 of cover 106 through the middle of the curved receiving area 711 of pin receiving portion 702. Since the diameter of pin 208 is smaller than the curved receiving area 711, the pin 208 can be inserted into contact 700 with little or no force by the person or machine actually inserting the pin 208. In other words, the pin receiving portion 702 of the contact 700 provides no resistance to the insertion of pin 208. Given the relative density of the pin grid arrays of modern day processors, the ZIF feature of a PGA socket becomes increasingly important from a manufacturing point of view. Furthermore, the use of a ZIF PGA socket decreases the likelihood that the pins or contact might bend or break during the insertion process. Once the pin 208 is inserted through the curved receiving area 711, a CAM mechanism such as micro ZIF PGA CAM mechanism 104 is operated to move pin 208 from the curved receiving area 711 to the contact area 713 and thereby into registration with contact arm end 706 and back plate 705 and into electrical engagement therewith, as indicated by the term "Position D."

Although various embodiments are specifically illustrated and described herein, it will be appreciated that modifications and variations of the present invention are covered by the above teachings and within the purview of the appended claims without departing from the spirit and intended scope of the invention.

What is claimed:

1. A contact to electrically connect at least one pin to a printed circuit board, comprising:

a pin receiving portion to receive the pin comprising a pair of contacts arms each having a curved portion and a straight portion, said contact arms positioned so that said curved portions form a curved receiving area with said straight portions substantially parallel to each other to form a contact area; and a tail portion to connect said contact to the printed circuit board the tail portion has a first side and second side, with each side having a tail portion top shoulder, a tail portion bottom shoulder and a tail portion center, with said tail portion center connecting said tail portion top shoulder with said tail portion bottom shoulder; and a center portion connecting said pin receiving portion to said tail portion.

2. The contact of claim 1, wherein said tail portion comprises a solder ball receiving portion, with said solder ball receiving portion forming a radial curve to increase contact points between said solder ball receiving portion and a solder ball.

3. The contact of claim 1, wherein said curved receiving area is configured to receive a pin from a pin grid array, and once said pin is received, a locking mechanism is operated to move said pin from said curved receiving area and into registration with said contact area and into electrical engagement therewith.

4. The contact of claim 1, wherein said tail portion centers are substantially parallel to one another.

5. The contact of claim 1, wherein said tail portion top shoulder of said first side is substantially parallel to said tail portion bottom shoulder of said second side, and said tail portion top shoulder of said second side is substantially parallel to said tail portion bottom shoulder of said first side.

6. The contact of claim 1, wherein said contact has an inductance value of approximately 3.7 nanohenrys.

7. The contact of claim 1, wherein said center portion has a width of approximately 0.034 inches, and a height of approximately 0.0650 inches.

8. The contact of claim 1, wherein each contact arm has a contact arm end, with each contact arm end having a radially curved portion.

9. A contact to electrically connect at least one pin to a printed circuit board, comprising:

a pin receiving portion to receive the pin comprising a single contact arm and back plate, said contact arm having a curved portion and a straight portion, said contact arm position so that said curved portion forms a curved receiving area with said back plate, and said straight portion forms a contact are with said back plate;

a tail portion to connect said contact to the printed circuit board, the tail portion has a first side and second side, with each side having a tail portion top shoulder, a tail portion bottom shoulder and a tail portion center, with said tail portion center connecting said tail portion top shoulder with said tail portion bottom shoulder;

a center portion connecting said pin receiving portion to said tail portion.

10. The contact of claim 9, wherein said tail portion comprises a solder ball receiving portion, with said solder ball receiving portion forming a radial curve to increase contact points between said solder ball receiving portion and a solder ball.

11. The contact of claim 9, wherein said curved receiving area is configured to receive a pin from a pin grid array, and once said pin is received, a locking mechanism is operated to move said pin from said curved receiving area and into registration with said contact area and into electrical engagement therewith.

12. The contact of claim 9, wherein said tail portion centers are substantially parallel to one another.

13. The contact of claim 9, wherein said tail portion top shoulder of said first side is substantially parallel to said tail portion bottom shoulder of said second side, and said tail portion top shoulder of said second side is substantially parallel to said tail portion bottom shoulder of said first side.

14. The contact of claim 9, wherein said contact has an inductance value of approximately 3.7 nanohenrys.

15. The contact of claim 9, wherein said center portion has a width of approximately 0.034 inches, and a height of approximately 0.0650 inches.

16. The contact of claim 9, wherein said contact arm has a contact arm end, with said contact arm end having a radially curved portion.

17. The contact of claim 15, wherein said center portion and said tail portion have substantially the same widths for the entire length of each of said portions.

18. The contact of claim 17, wherein said width is approximately 0.034 inches.

19. A micro zero insertion force pin grid array socket, comprising:

an insulating cover having a plurality of apertures;

a contact in each of said apertures, said contact comprising a pin receiving portion to receive a pin comprising a pair of contact arms each having a curved portion and a straight portion, said contact arms positioned so that said curved portions form a curved receiving area with said straight portions substantially parallel to each other to form a contact area, a tail portion to connect said contact with a printed circuit board, the tail portion has a first side and second side, with each side having a tail portion top shoulder, a tail portion bottom shoulder and a tail portion center, with said tail portion center connecting said tail portion top shoulder with said tail portion bottom shoulder, and a center portion to connect said pin receiving portion to said tail portion.

20. The socket of claim 19, further comprising a locking mechanism, wherein said receiving area is configured to receive a pin from a pin grid array, and once said pin is received, said locking mechanism is operated to move said pin from said receiving area and into registration with said contact area and into electrical engagement therewith.

21. The socket of claim 20, wherein said tail portion comprises a solder ball receiving portion, with said solder ball receiving portion forming a radial curve to increase contact points between said solder ball receiving portion and a solder ball.

* * * * *